(12) United States Patent
Ono et al.

(10) Patent No.: US 6,807,974 B2
(45) Date of Patent: Oct. 26, 2004

(54) SINGLE WAFER TYPE SUBSTRATE CLEANING METHOD AND APPARATUS

(75) Inventors: Yuji Ono, Ota-ku (JP); Ryoichi Ohkura, Hachioji (JP)

(73) Assignee: S.E.S. Company Limited, Tokyo (JP)

( * ) Notice: Subject to any disclaimer, the term of this patent is extended or adjusted under 35 U.S.C. 154(b) by 4 days.

(21) Appl. No.: 10/286,818

(22) Filed: Nov. 4, 2002

(65) Prior Publication Data

US 2003/0047192 A1 Mar. 13, 2003

Related U.S. Application Data

(62) Division of application No. 09/940,788, filed on Aug. 29, 2001.

(30) Foreign Application Priority Data

Dec. 5, 2000 (JP) .......................................... 2000-370718

(51) Int. Cl.$^7$ ................................................ B08B 5/00
(52) U.S. Cl. ...................... 134/153; 134/95.2; 134/144; 134/902
(58) Field of Search ............................... 134/95.2, 95.3, 134/102.3, 144, 149, 153, 172, 198, 902; 34/582, 585, 593, 85, 168

(56) References Cited

U.S. PATENT DOCUMENTS

| | | | | |
|---|---|---|---|---|
| 4,544,446 A | * | 10/1985 | Cady | 438/689 |
| 5,849,135 A | * | 12/1998 | Selwyn | 156/345.47 |
| 6,190,732 B1 | * | 2/2001 | Omstead et al. | 427/248.1 |
| 6,247,479 B1 | * | 6/2001 | Taniyama et al. | 134/95.2 |
| 6,273,104 B1 | * | 8/2001 | Shinbara et al. | 134/25.4 |
| 6,473,993 B1 | * | 11/2002 | Yagi et al. | 34/380 |

* cited by examiner

Primary Examiner—Frankie L. Stinson
Assistant Examiner—Joseph L Perrin
(74) Attorney, Agent, or Firm—Armstrong, Kratz, Quintos, Hanson & Brooks, LLP

(57) ABSTRACT

In the drying step of the single wafer type substrate cleaning system for cleaning wafers not stored in a cassette, in a sealed cleaning housing, a spin drying treatment is applied to the wafer when the wafer is supported and rotated at high speed while an inert gas for preventing oxidation is supplied to the face of the wafer, and the amount of the inert gas to be supplied to the face of the wafer is larger at the outer peripheral portion of the wafer than that supplied at the center thereof, thereby preventing oxidation on the face of the wafer effectively while optimizing the benefits of the single wafer type cleaning system.

9 Claims, 5 Drawing Sheets

SINGLE WAFER TYPE SUBSTRATE CLEANING METHOD AND APPARATUS

This application is a division of prior of application Ser. No. 09/940,788 filed Aug. 29, 2001.

BACKGROUND OF THE INVENTION

1. Field of the Invention

The invention relates to a single wafer type substrate cleaning method and a single wafer type substrate cleaning apparatus, more particularly to a single wafer type wet cleaning technique or system for applying a cleaning treatment to substrates such as semiconductor wafers one by one during the fabrication process as well as certain devices such as electronic parts and the like.

2. Prior Art

A so-called batch type wet cleaning system has been the principal method of cleaning substrates such as semiconductor wafers (hereinafter referred to simply as "Wafers"), whereby wafers stored in a carrier cassette are immersed in sequence in wet bench type cleaning baths arranged in series, or wafers are directly immersed in the cleaning baths through a transfer unit without being stored in a carrier cassette. However, semiconductor devices have reached the sub micron age, in that they are now micro-fabricated and highly integrated, such that the face of wafers has recently required a very high degree of cleaning density, and wafers which are not stored in a cassette have to be wet-cleaned individually in a sealed cleaning housing. To this end, a so-called single wafer type wet cleaning system intended to meet the requirement of a higher cleaning density has been developed.

Under the single wafer type wet cleaning system, wafers can be cleaned with the use of a simple and compact cleaning system in a relatively clean atmosphere where particles and the like do not settle or remain on the face of the wafer. This system is therefore practical to use for small scale production.

Under the single wafer type cleaning system, wafers can be cleaned by the application of various chemical fluids on the face of wafers in a predetermined order, and finally dried by a spin drying treatment whereby the wafers are rotated at high speed. However, there are cases where oxygen remains in the sealed cleaning housing during the drying treatment phase depending on the kind of chemical fluid used, such that the face of a wafer is prone to oxidization. Accordingly, improvement of the system is desirable.

SUMMARY OF THE INVENTION

The present invention has been made in view of the aforementioned conventional problems, and it is the object of the invention to provide a single wafer type cleaning method capable of effectively preventing the face of the wafer from becoming oxidized while optimizing the benefits of the single wafer type wet cleaning system for individually cleaning wafers which are not stored in a cassette in a sealed cleaning housing.

Another object of the invention is to provide a single wafer type cleaning apparatus having the means of carrying out the single wafer type cleaning method set forth above as the first object of the invention.

To achieve these objectives, the proposed method comprises the application of a spin drying treatment to the wafer when the wafer is supported and rotated at high speed while an inert gas for preventing oxidation is supplied to the face of the wafer during the drying process, and the inert gas supplied to the face of the wafer is such that the amount supplied at the outer region of the wafer is larger than that supplied at the center thereof.

In the preferred embodiment, a sealed drying space is intended to be formed at the outer region of the face of the wafer and inert gas is supplied to the inside of the sealed drying space, wherein the inert gas is a nitrogen gas (hereinafter referred to as "$N_2$ gas").

Further, the single wafer type cleaning apparatus of the invention which is deemed suitable for carrying out the foregoing cleaning method comprises (1) a wafer rotary means for supporting and rotating a single wafer in a horizontal position in the cleaning housing; (2) a cleaning chamber provided at the outer region of the wafer rotary means for the purpose of forming a cleaning treatment space for the wafer which is rotatably supported by the wafer rotary means; (3) a chemical fluid supply means for supplying cleaning fluid to the face of the wafer which is rotatably supported by the wafer rotary means; (4) and an inert gas supply means for supplying $N_2$ gas intended to prevent oxidation on the face of the wafer which is rotatably supported by the wafer rotary means, wherein the supply port of the inert gas supply means is designed in such a manner that the amount of $N_2$ gas supplied to the outer region of the face of the wafer is larger than that at the center thereof.

In the preferred embodiment, the inert gas supply means has a gas injection section consisting of a circular cover body intended to form a sealed drying space at the outer region of the face of the wafer which is rotatably supported by the wafer rotary means while cooperating with the cleaning chamber, wherein the gas injection section comprises a flat hollow body which communicates with an inert gas supply source at the inside thereof and the supply port at the plane bottom portion.

The supply port of the gas injection section comprises a plurality of injection openings which are disposed radially and arranged concentrically with the face of the wafer, which is rotatably supported by the wafer rotary means, and these injection openings are designed in such a manner that the sum of the areas of the injection openings at the outer region of the face of the wafer is larger than that at the center thereof as the injection openings direct toward the outer region of the wafer.

Further, a baffle plate is interposed in the hollow section of the gas injection section to prevent the inert gas from directly flowing to the center of the supply port of the inert gas.

Under the single wafer type cleaning system of the invention, the face of the wafer is cleaned by employing various chemical fluids in the sealed cleaning housing in a predetermined order, and finally the wafer is dried through a spin drying treatment while the wafer is rotated at high speed, in which case, oxygen will likely remain in the sealed cleaning chamber during the drying process depending on the kind of chemical fluid(s) used, resulting in oxidation on the face of the wafer.

To address the foregoing problem, the invention proposes to provide a spin drying treatment to the wafer which is supported and rotated by the wafer rotary means at high speed while being supplied with $N_2$ gas for preventing oxidation on the face of the wafer.

The degree of oxidation on the wafer depends on the concentration of oxygen in the circum-ambient atmosphere on the face of the wafer, and it has been found, as a result of research and tests conducted by the inventors, that concentration of oxygen in the circum-ambient atmosphere on the face of the wafer is higher at the outer peripheral portion of the face of the wafer than that at the center thereof in an ordinary state.

It is thus necessary to make the concentration of oxygen at the outer peripheral portion of the face of the wafer to become zero (0) or close to zero (0) so as to prevent oxidation on the wafer, and to achieve this, the cleaning housing should be purged by supplying $N_2$ gas to the inside thereof. This however requires a considerable volume of $N_2$ gas which would increase running costs and is therefore uneconomical.

According to the invention, the amount of $N_2$ gas to be supplied to the face of the wafer must be such that the amount supplied to the outer peripheral portion of the wafer is larger than that at the center thereof so that concentration of oxygen is allowed to become zero (0) or close to zero (0) while reducing the usage of $N_2$ gas as much as possible in order to prevent oxidation on the face of the wafer.

Described more in detail, the drying process of the single wafer type cleaning system for individually cleaning wafers which are not stored in a cassette in the sealed cleaning housing, entails the support and rotation of the wafer at high speed by the wafer rotary means, thereby applying a spin drying treatment to the wafer while $N_2$ gas for preventing oxidation is supplied to the face of the wafer, and the amount of inert gas supplied to the face of the wafer is such that the amount of inert gas supplied to the outer peripheral portion of the wafer is larger than that at the center thereof. Accordingly, it is possible to improve and enhance the usefulness of the single wafer type cleaning system by providing a method of effectively preventing oxidation on the face of the wafer.

That is, under the single wafer type cleaning system, the wafer is cleaned by the introduction of various chemical fluids in the sealed cleaning housing in a predetermined order, and finally dried through a spin drying treatment while the wafer is rotated at high speed, and simultaneously supplying an $N_2$ gas for preventing oxidation on the wafer. The degree of oxidation that develops on the wafer depends on the concentration of oxygen in the circum-ambient atmosphere on the face of the wafer.

According to the invention therefore, if the amount of $N_2$ gas supplied to the face of the wafer is such that the amount of $N_2$ gas supplied to the outer peripheral portion of the wafer is larger than that at the center thereof, the concentration of oxygen is substantially reduced to zero (0) or close to zero (0) while the usage of $N_2$ gas is decreased as much as possible, thereby preventing oxidation on the face of the wafer.

PREFERRED EMBODIMENT OF THE INVENTION

The preferred embodiment of the invention is described with reference to the attached drawings.

Figure 1:
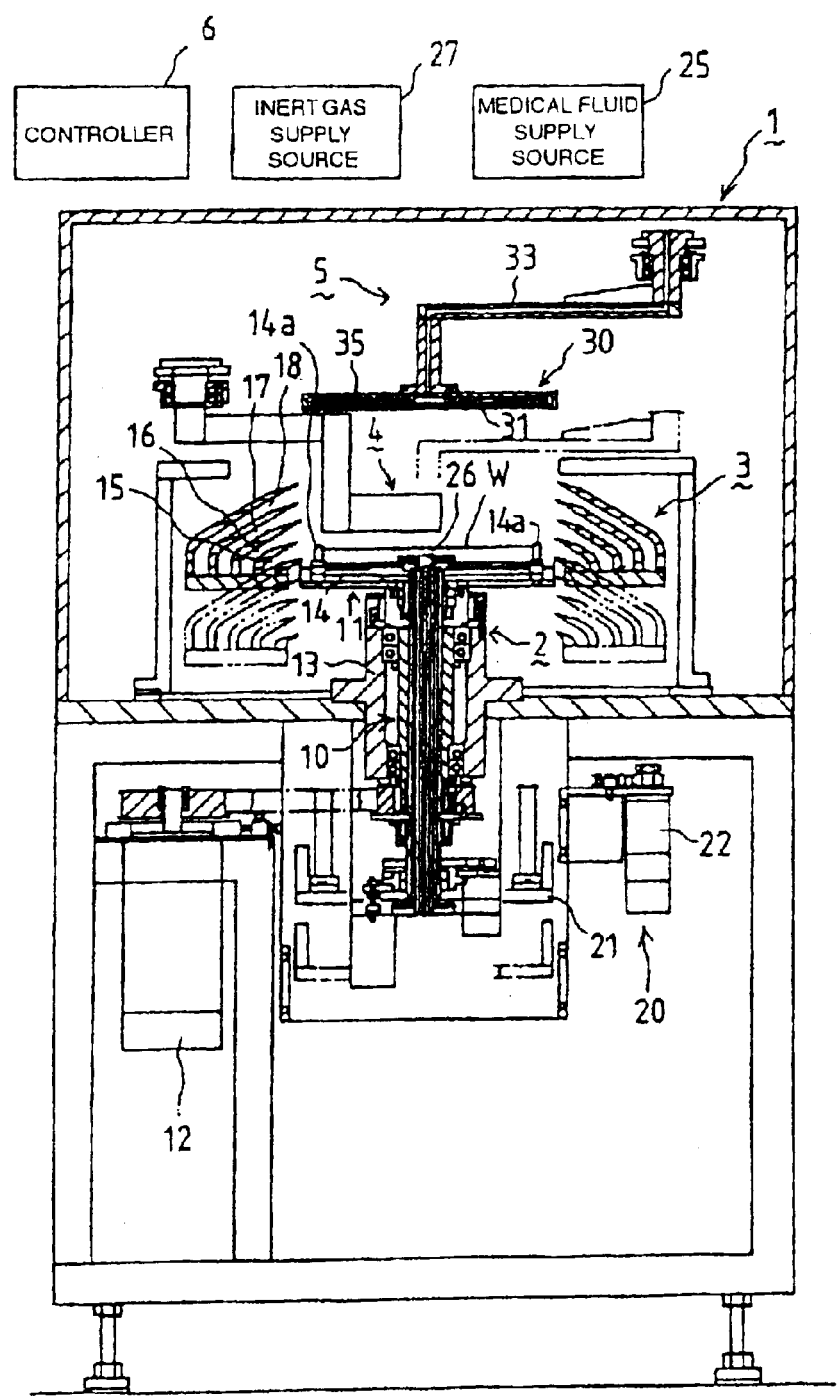
FIG. 1 is a front sectional view showing the internal construction of a single wafer type cleaning apparatus according to the preferred embodiment of the invention.

A single wafer type cleaning apparatus is illustrated in FIG. 1, wherein each wafer W, which is not stored in a cassette, is wet-cleaned individually in a sealed cleaning housing 1, and the sealable cleaning housing 1 comprises a wafer rotary section (wafer rotary means) 2 for rotatably supporting one wafer W in the horizontal position, a cleaning chamber 3 which is relatively vertically movable, a chemical fluid supply section (chemical fluid supply means) 4 for supplying the cleaning fluid, an inert gas supply section (inert gas supply means) 5 for supplying the $N_2$ gas for oxidation prevention, and a controller 6 for controlling these driving sections while interlocking mutually therewith as major components.

The cleaning housing 1 is sealable at the upper portion for the cleaning treatment and serves as a location for installing various unit driving sections at the lower portion disposed in the upper space. A closable wafer taking in-out port, not shown in detail, through which the wafer W is taken in or taken out in the upper space of the cleaning housing 1, is structured in such a way to secure airtightness and watertightness when it is closed.

The wafer rotary section 2 horizontally rotates a single wafer W while it supports the single wafer W in the horizontal position when the spin cleaning and spin drying treatments are applied thereto, and it comprises a rotary shaft 10, a wafer supporting section 11 which is attached to and supported by the upper end portion of the rotary shaft 10 in the horizontal position, and a driving motor 12 for rotatably driving the rotary shaft 10.

The wafer supporting section 11 and the rotary shaft 10 are rotatably disposed at the center of the cleaning housing 1 via a bearing supporting cylinder 13 in a perpendicular position, and a single wafer W can be supported by the wafer supporting section 11 in the horizontal state.

Figure 2:
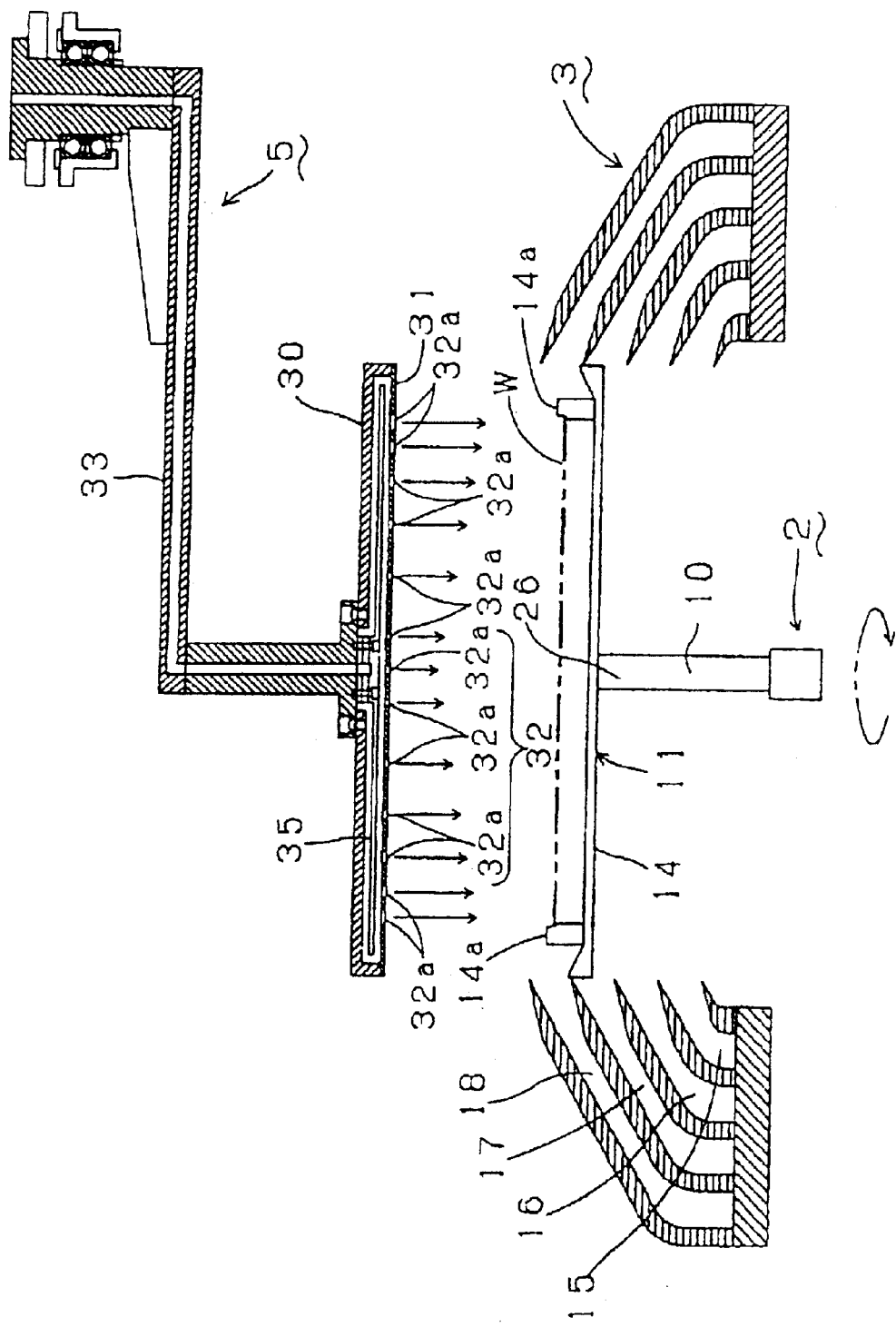
FIG. 2 is an enlarged sectional front view showing the locational relationship between the wafer rotary section and the inert gas supply section of the single wafer type cleaning apparatus.
Figure 3:
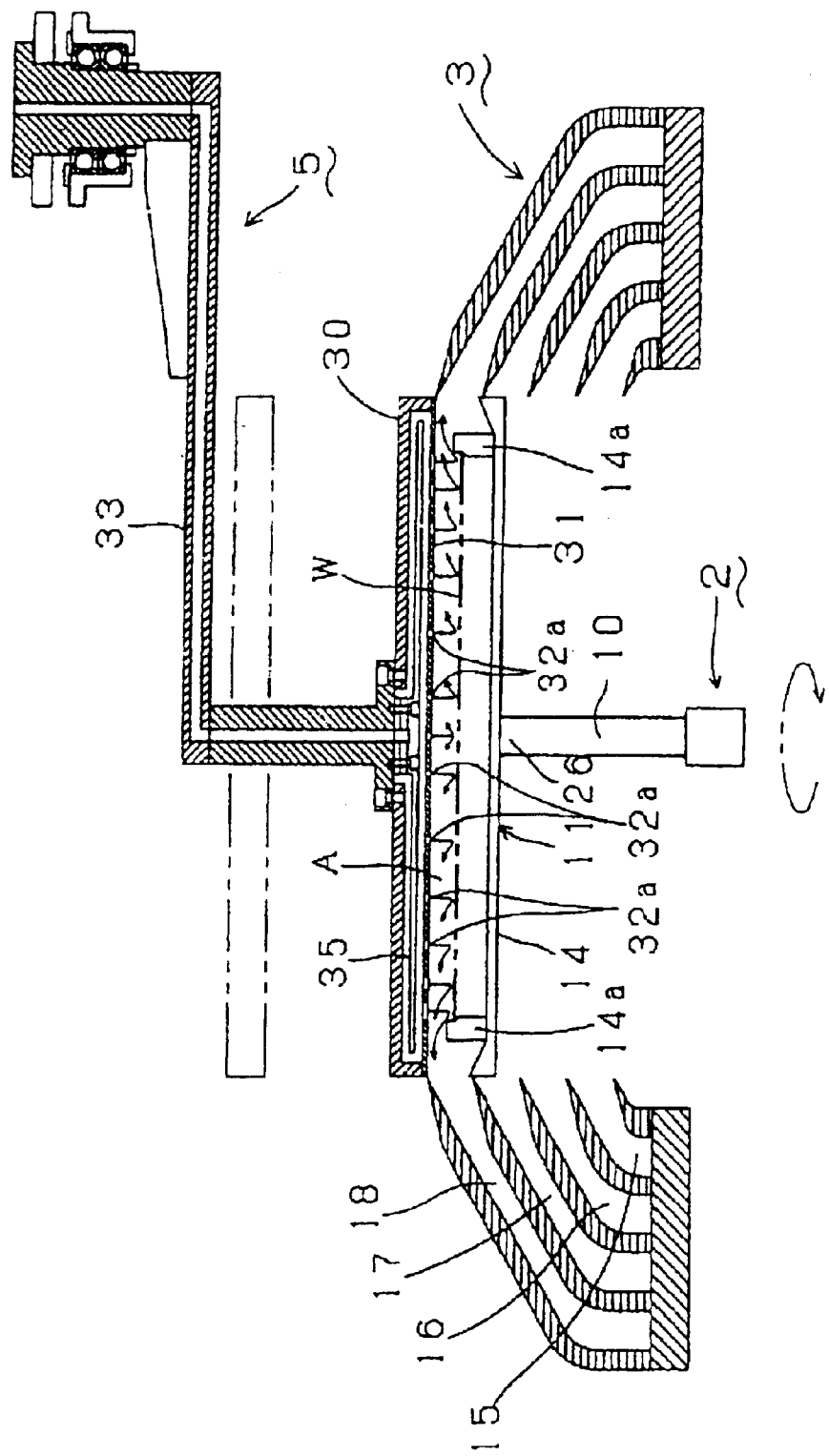
FIG. 3 is an enlarged sectional front view showing the locational relationship between the wafer rotary section and the inert gas supply section in the drying step.

In particular, the wafer supporting section 11 is provided with a wafer mounting section 14 for mounting and supporting the peripheral edge of the wafer W as shown in FIGS. 2 and 3.

The wafer mounting section 14 is supported horizontally by the wafer supporting section 11 and is composed of a cup body which is inclined at the peripheral edge thereof and rises towards the outer region. The wafer mounting section 14 has a plurality of claws 14a, 14a, etc. for supporting the outer edge of the wafer W. The claws 14a, 14a, etc. of the wafer mounting section 14 are designed to have the same height, in order that the peripheral edge of the wafer W can be supported in the horizontal position. The supporting face of each claw 14a has a configuration corresponding to the contour of the peripheral edge of the wafer W in cross section, and the peripheral edge corner section of each claw 14a can contact and support the square peripheral edge of the wafer W in cross section in a point contact state or line contact state.

The rotary shaft 10 is rotatably supported by the bearing supporting cylinder 13 in the standing position, and the lower end portion of the rotary shaft 10 is connected to the driving motor 12 so as to be rotatably driven by the driving motor 12 via a belt entrained therebetween so that the wafer supporting section 11 is rotated at a given speed of rotation. The speed of rotation of the rotary shaft 10 is set at low speed, e.g., 40–50 r.p.m. when the spin cleaning treatment is effected while it is set at high speed of 3000 r.p.m. when the spin drying treatment is effected.

The cleaning chamber 3 is the section where the cleaning treatment is applied to the wafer W, and the inner diameter dimensions thereof are determined in connection with the wafer supporting section 11 of the wafer rotary section 2, described hereinbelow, and has a cleaning treatment space for the wafer W, which is rotatably supported by the wafer rotary section 2, at the outer region of the wafer rotary section 2.

In detail, the cleaning chamber 3 has plural stages of annular treatment baths 15 to 18 which are arranged vertically at the inner periphery thereof as shown in FIGS. 1 and 2, and is constructed to move up and down vertically relative to the wafer rotary section 2.

In the illustrated preferred embodiment, the four stages of annular treatment baths 15 to 18 are arranged vertically and concentrically with the wafer W so as to surround the wafer W which is supported by the wafer supporting section 11 of the wafer rotary section 2.

The peripheral inner edges of the annular treatment baths 15 to 18 are arranged in the manner that annular gaps defined between these edges are set to have small intervals to such extent for preventing the chemical fluid(s) and the like from being leaked downward and at the same time do not contact the outer diameter edge of the wafer supporting section 11 of the wafer rotary section 2.

The cleaning chamber 3 is constructed to be movable up and down, i.e., vertically via an elevating guide (not shown), and has an elevating mechanism 20 capable of elevating relative to the wafer supporting section 11 of the wafer rotary section 2 by a given stroke.

The elevating mechanism 20 comprises a feed screw mechanism (not shown), which moves a supporting frame 21 for supporting the cleaning chamber 3 up and down, and a driving motor 22 for rotatably driving the feed screw mechanism.

Depending on the cleaning treatment step, the cleaning chamber 3 is moved up and down vertically by a given stroke via the feed screw mechanism when the driving motor 22 is driven while interlocking with the operation of the wafer rotary section 2, described hereinbelow, so that any one of the annular treatment baths 15 to 18 for effecting the cleaning treatment step may be selected from a position of height relative to the wafer W which is supported by the wafer supporting section 11 of the wafer rotary section 2.

Drain sections, which communicate with the outside of the apparatus, are respectively provided in the four annular treatment baths 15 to 18 (not illustrated in detail). These drain sections discharge the chemical fluid(s) or the inert gas inside the annular treatment baths 15 to 18, in which they are structured to be opened only when the cleaning treatment is effected and to be closed when the cleaning treatment is effected in the other treatment baths.

The chemical fluid supply section 4 supplies the chemical fluid(s) to the face of the wafer W which is rotatably supported by the wafer rotary section 2, and it is provided on the upper portion of the cleaning housing 1 and can communicate with the chemical fluid supply source 25 provided outside the cleaning housing 1.

The chemical fluid supply section 4 is composed of injection nozzles for injecting and supplying cleaning fluid(s) to the face of the wafer W from above, which wafer W is rotatably supported by the wafer supporting section 11 of the wafer rotary section 2. The chemical fluid supply section 4 is structured so that it may be turned horizontally in a downward direction over the cleaning housing 1, and it is directly connected to a driving motor capable of being swung (not shown).

The chemical fluid supply section 4 is constructed to inject and supply the cleaning fluid to the face of the wafer W which is rotatably supported by the wafer supporting section 11 of the wafer rotary section 2 in the horizontal position while the face of the wafer is turned horizontally from its outer peripheral portion toward the center thereof.

In the illustrated preferred embodiment shown in FIGS. 1 to 5, the chemical fluid supply section 4 has nozzle ports each of which is identified by a number corresponding to the kind of cleaning fluid(s) to be supplied. In particular, three nozzle ports are provided (not shown) intended to serve as supply ports for an APM fluid, purified water and a DHF fluid Injection nozzles 26 are opened at the upper end portion of the rotary shaft 10 corresponding to the chemical fluid supply section 4, have the same number of nozzle ports as those of the chemical fluid supply section 4, i.e., three nozzle ports, and are constructed in such a way as to inject and supply cleaning fluid to the back face of the wafer W from the lower side. The injection nozzles 26 can communicate with the fluid supply source 25 via an internal pipe of the rotary shaft 10, and serve as supply ports for an APM fluid, purified water and a DHF fluid.

As a result, the wafer W can be cleaned at the front and back faces thereof at the same time or selectively.

The inert gas supply section 5 supplies the inert gas for preventing oxidation on the face of each wafer W which is rotatably supported by the wafer rotary section 2 and can communicate with an inert gas supply source 27 provided on the upper portion of the cleaning housing 1. In the illustrated preferred embodiment, a $N_2$ gas is used as the inert gas.

The inert gas supply section 5, as shown in FIG. 3 in detail, is provided with a gas injection section 30 composed of a circular cover body forming the drying sealed space A at the outer region of the face of the wafer W which is rotatably supported by the wafer rotary section 2 while cooperating with the cleaning chamber 3.

The outer periphery of the gas injection section 30, as shown in FIG. 3, is designed to engage with the inner peripheral portion of the cleaning chamber 3, namely, the outer periphery of the uppermost stage treatment bath 18, whereby the sealed drying space A of necessary irreducible minimum volume is formed at the outer peripheral portion of the face of the wafer W which is rotatably supported by the wafer rotary section 2.

The gas injection section 30 comprises a flat hollow body communicating with the inert gas supply source 27 via a communication pipe 33 at the inside thereof, and has a supply port 32 at its bottom portion as viewed from the above, namely, from the bottom plate 31 consisting of a flat plate.

The supply port 32 comprises a plurality of injection openings 32a, 32a, etc. which are radially disposed and concentrically arranged with the face of the wafer W which is rotatably supported by the wafer rotary section 2 (see FIG. 4), and structured in such a manner that the amount of $N_2$ gas supplied to the face of the wafer W at the outer peripheral portion of the wafer W is larger than that at the center thereof. The rationale for the construction of the supply port 32 is stated hereinbelow.

Figure 5:
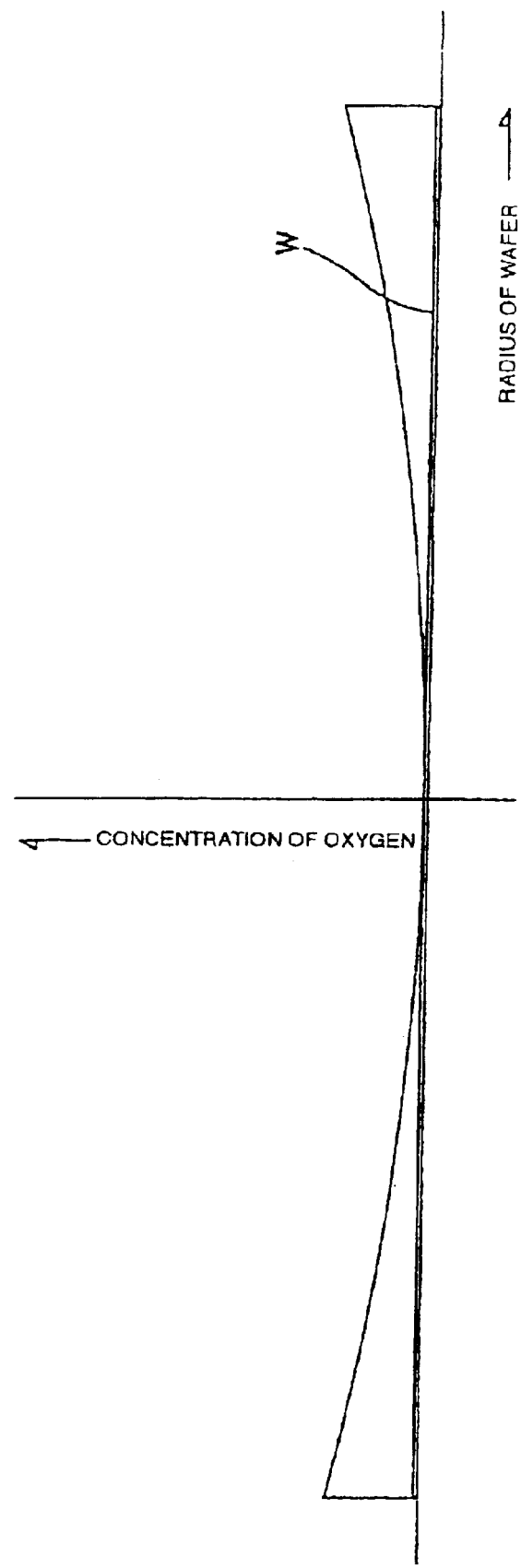
FIG. 5 is a view showing the distribution of the concentration of oxygen in the circum-ambient atmosphere on the face of a wafer which is supported by a wafer supporting section of the wafer rotary section in an ordinary state.

That is, the degree of oxidation on the wafer W depends on the concentration of oxygen in the circum-ambient atmosphere on the face of the wafer W, and it has been found, as a result of research and tests conducted by the inventors, that concentration of oxygen on the face of the wafer W in the circum-ambient atmosphere thereof is higher at the outer peripheral portion of the face of the wafer W than that at the center thereof in an ordinary state as it directs toward the outer region of the wafer W, as shown in FIG. 5.

It is therefore necessary to make the concentration of oxygen at the outer peripheral portion of the face of the wafer to become zero (0) or close to zero (0) in order to prevent oxidation on the wafer W, and to attain this objective, the cleaning housing must be entirely purged by supplying inert gas to the inside of the cleaning housing 1 which, as previously stated, requires a considerable volume of inert gas which would increase running costs and is therefore uneconomical.

Likewise, as already stated hereinabove, the amount of inert gas supplied to the face of the wafer must be such that the amount supplied to the outer peripheral portion of the wafer is larger than that at the center thereof so that concentration of oxygen is substantially reduced to zero (0) or close to zero (0) while decreasing the usage of the inert gas as much as possible, thereby realizing the objective of preventing oxidation on the face of the wafer.

Figure 4A:
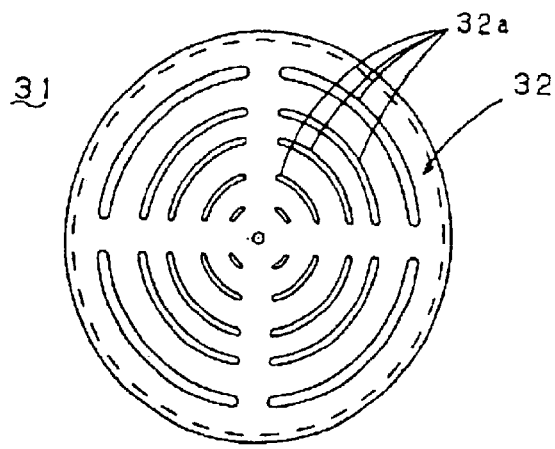
FIGS. 4(A) to (C) are bottom views respectively showing concrete constructions of the injection openings of the gas injection section in the inert gas supply section.

In order to concretely determine the amount of inert gas to be supplied to the face of the wafer W, it has been proposed that the sum of the areas of these injection openings 32a, 32a, etc. at the outer peripheral portion of the wafer W is larger than that at the center thereof and examples are shown in FIGS. 4(A), (B), (C) as the injection openings direct toward the outer peripheral portion of the wafer W.

That is, the injection openings 32a, 32a, etc. shown in FIG. 4(A) are composed of arc slits, and the length and width dimensions of such arc slits are determined to be larger at the outer peripheral portion of the face of the wafer W than those at the center thereof as the injection openings direct toward the outer peripheral portion of the wafer W.

Figure 4B:
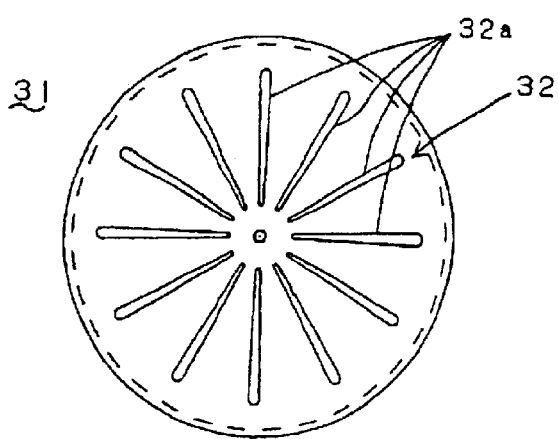

Further, the injection openings 32a, 32a, etc. shown in FIG. 4(B) are composed of radially extended slits, and the width dimensions of such slits at the outer peripheral portion of the face of the wafer W are determined to be larger than those at the center thereof as the injection openings direct toward the outer peripheral portion of the wafer W.

Figure 4C:
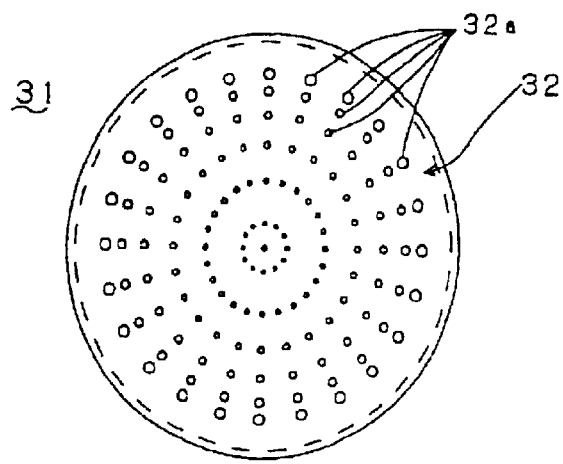

Further, the injection openings 32a, 32a, etc. shown in FIG. 4(C) consist of circular openings which are arranged circumferentially and radially at prescribed intervals, and the diameter dimensions thereof are determined to be larger at the outer peripheral portion of the face of the wafer W than those at the center thereof as the injection openings direct toward the outer peripheral portion of the wafer W.

Alternatively, although not shown, the number of disposition of the injection openings 32a, 32a, etc. is determined to be larger at the outer peripheral portion of the face of the wafer W than that at the center thereof, or, the number of disposition of the injection openings 32a, 32a, etc. may be combined with the construction of the areas of openings shown in FIGS. 4(A) to (C).

Although the amount of inert gas to be supplied can be controlled even by merely setting the number of disposition or areas of openings of the injection openings 32a, 32a, etc. according to the invention, a baffle plate 35 is interposed in the hollow section of the gas injection section 30 in addition to the construction set forth above.

The baffle plate 35 prevents the $N_2$ gas from directly flowing to the center of the supply port 32, and it consists of a discoid plate having a diameter smaller than the bottom plate 31 of the gas injection section 30.

The $N_2$ gas supplied to the inside of the gas injection section 30 via the communication pipe 33 flows to an outer peripheral edge along the upper face of the baffle plate 35 and turns around the outer peripheral edge, then reaches the supply port 32 of the bottom plate 31 so that a considerable volume of $N_2$ gas can be supplied to the outer region of the supply port 32.

Accordingly, the number of disposition and the areas of openings of the injection openings 32a, 32a, etc. constituting the supply port 32 have been designed considering the operation of the baffle plate 35, thereby prescribing a flow rate model of the $N_2$ gas to achieve a zero (0) concentration of oxygen in the circum-ambient atmosphere on the face of the wafer W (see arrows in FIG. 2) while reducing the usage of $N_2$ gas as much as possible.

Further, the gas injection section 30 is movable up and down between a use position, where it cooperates with the cleaning chamber 3, i.e., the height position shown in FIG. 3, and a use standby position, where the gas injection section 30 does not interfere with the chemical fluid supply section 4, i.e., the height position shown in FIG. 1, and drivably connected to an elevating means, not shown.

The fluid supply source 25 is intended to supply a chemical fluid for cleaning to the chemical fluid supply section 4, i.e., injection nozzles 4 and 26, and has two chemical fluid systems, in the illustrated embodiment, by which the wafer W is to be cleaned with APM fluid ($NH_4OH+H_2O_2+H_2O$) or with DHF fluid ($HF+H_2O$). Annular treatment baths 15 to 18 in the cleaning chamber 3 correspond to these two chemical fluid systems, namely, the lowermost stage treatment bath 15 is used for the cleaning step by APM fluid, the third upper stage treatment bath 16 is used for the cleaning step by DHF fluid, the second upper stage treatment bath 17 is used for the rinsing step by purified water, and the uppermost stage treatment bath 18 is used for the spin drying step.

Under the single wafer type cleaning apparatus having the aforedescribed construction, when the cleaning chamber 3 is moved up and down, either the wafer W supported by the wafer supporting section 11 of the wafer rotary section 2 or the circular treatment baths 15 to 18 of the cleaning chamber 3 are selectively positioned, and the wafer W supported by the wafer supporting section 11 is horizontally rotatable by the wafer rotary section 2 at a prescribed speed of rotation.

The chemical fluid supply source 27 is constructed to selectively effect cleaning steps of i) APM+DHF+($O_3$+DIW)+DRY, ii) APM+DHF+DRY, iii) APM+DRY, DHF+DRY or the like, with the cooperation of the inert gas supply source 37, described hereinbelow, by appropriately selectively setting a recipe for cleaning steps.

The controller 6 controls the movement of these components of the single wafer type cleaning apparatus while interlocking with these components, so that the following series of wet treatment steps are automatically effected:

(1) The wafer W, before the cleaning treatment is applied thereto, is placed in the wafer supporting section 11 inside the cleaning chamber 3 via the wafer taking in/out port of the cleaning housing 1, (not shown), and when the cleaning chamber 3 is sealed, the wafer W is positioned at the wafer cleaning treatment position inside the cleaning chamber 3 when the cleaning chamber 3 is moved up and down, and then various cleaning treatments are effected in a predetermined procedure.

(2) For example, if the cleaning treatment is in the foregoing ii) cleaning treatment step (APM+DHF+DRY), the wafer W on the wafer supporting section 11 is positioned and disposed in the lowermost stage treatment bath 15 when the cleansing chamber 3 is moved up and down in such a way that the APM fluid is supplied from the injection nozzle 4, and a spin cleaning treatment is applied to the wafer W when the wafer rotary section 2 is rotated at low speed.

(3) Subsequently, the wafer W is positioned and disposed in the second upper stage treatment bath 17, and purified water is supplied from the injection nozzle 4 and a rinsing treatment is applied to the wafer W when the wafer rotary section 2 is rotated at low speed.

(4) Further, the wafer W is positioned and disposed in the third upper stage treatment bath 16, and the DHF fluid is supplied from the injection nozzle 4 and a spin cleaning treatment is applied to the wafer W when the wafer rotary section 2 is rotated at low speed.

(5) Further, the wafer W is positioned and disposed in the second upper stage treatment bath 17, and purified water is supplied from the injection nozzle 4, and a rinsing treatment is applied to the wafer W when the wafer rotary section 2 is rotated at low speed.

(6) Finally, the wafer W is positioned and disposed in the uppermost stage treatment bath 18, and a spin drying treatment is applied to the wafer W when the wafer rotary section 2 is rotated at high speed.

In the drying step, the gas injection section 30 of the inert gas supply section 5 is lowered to a position shown in FIG. 3 to cooperate with the cleaning chamber 3 so as to form the sealed drying space A and then the $N_2$ gas is supplied to the sealed drying space A. The amount of $N_2$ gas supplied to the face of the wafer W is such that the amount of $N_2$ gas supplied to the outer peripheral portion of the face of the wafer W is larger than that at the center thereof.

Accordingly, when the inside of the sealed drying space A is cleaned by the $N_2$ gas, or when occasion demands, air current is produced in the passageway extending from the inert gas supply section 5 to the drain section inside the sealed drying space A owing to the forceful discharge of the $N_2$ from the drain section of the uppermost stage treatment bath 18, concentration of oxygen at the entire outer region of the face of the wafer W is reduced to zero (0) or close to zero (0), when the spin drying treatment is applied to the wafer W.

(7) The wafer W is again taken out via the wafer taking in/out port of the cleaning housing 1 upon completion of a series of cleaning treatments in the wafer cleaning apparatus.

Under the single wafer type cleaning apparatus constructed in the aforedescribed manner, the cleaning steps by the utilization of various kinds of chemical fluids are effected relative to the face of the wafer W in the sealed cleaning housing 1 in a predetermined order. Thereafter, the drying step proceeds through the spin drying treatment by which the wafer W is rotated at high speed by the wafer rotary section while an $N_2$ gas is supplied to the face of the wafer W the wafer W, thereby preventing oxidation on the wafer W.

In this case, the $N_2$ gas supplied to the face of the wafer W is such that the amount of $N_2$ gas supplied to the outer peripheral portion of the face of the wafer W is larger than that at the center thereof thereby reducing the usage of the $N_2$ gas as much as possible to allow the concentration of oxygen to become zero (0) or close to zero (0), thereby preventing oxidation on the face of the wafer W.

Although the foregoing embodiment is the preferred embodiment of the invention, the invention is not limited thereto but can be designed and modified in various ways within the scope of the invention.

For example, the wafer cleaning apparatus can be used as a single apparatus, or as a basic construction element of a wafer cleaning system provided with a loading section, an unloading section or other types of equipment such as placing and mounting robots and the like. Further, the chemical fluids employed by the preferred embodiment are merely samples, and hence other chemical fluids such as HPM ($HCL+H_2O_2+H_2O$), SPM ($H_2SO_4+H_2O_2+H_2O$) and the like can be used depending on the object thereof.

What is claimed is:

1. A single wafer type substrate cleaning apparatus for cleaning wafers, which are not stored in a cassette, one by one in a sealed cleaning housing, said apparatus comprising of:

a wafer rotary means for supporting and rotating a single wafer in the cleaning housing in the horizontal position;

a cleaning chamber provided at the outer peripheral portion of the wafer rotary means for forming a cleaning treatment space for cleaning each wafer which is rotatably supported by the wafer rotary means, wherein the cleaning chamber is movable up and down relative to the wafer rotary means, and the plural stages of the annular treatment baths forming the cleaning treatment space are arranged vertically in and concentrically with an inner peripheral portion of the cleaning chamber so as to surround the wafer supported by the treatment step to be employed, one of the annular treatment baths is accordingly moved to a position corresponding to the wafer supported by the wafer rotary means when the cleaning chamber is moved up and down;

a chemical fluid supply means for supplying cleaning fluid(s) to the face of the wafer which is rotatably supported by the wafer rotary means; and an inert gas supply means for supplying inert gas to prevent oxidation on the face of the wafer which is rotatably supported by the wafer rotary means;

wherein the number of supply ports of the inert gas supply means is such that the number of supply ports at the outer peripheral portion of the face of the wafer is larger than that at the center thereof.

2. The single wafer type substrate cleaning apparatus according to claim 1, wherein the inert gas supply means has a gas injection section consisting of a circular cover body for forming the sealed drying space at the outer peripheral portion of the face of the wafer which is rotatably supported by the wafer rotary means while cooperating with the cleaning chamber, wherein the gas injection section comprises a flat hollow body which communicates with an inert gas supply source at the inside thereof and has the supply ports at the plane bottom portion.

3. The single wafer type substrate cleaning apparatus according to claim 2, whereby the supply ports of the gas injection section comprise a plurality of injection openings which are disposed radially and arranged concentrically with the face of the wafer, and the sum of the areas of openings of these injection openings is determined to be larger at the outer peripheral portion of the face of the wafer than that at the center thereof as the injection openings direct toward the outer peripheral portion of each wafer.

4. The single wafer type substrate cleaning apparatus according to claim 3, wherein the area of the injection openings is determined to be larger at the outer region of the face of the wafer than at the center thereof as the injection openings direct toward the outer region of the wafer.

5. The single wafer type substrate cleaning apparatus according to claim 3, wherein the number of disposition of the injection openings is determined to be larger at the outer region of the face of the wafer than at the center thereof as the injection openings direct toward the outer peripheral portion of the wafer.

6. The single wafer type substrate cleaning apparatus according to claim 3, further comprising a baffle plate which is interposed in the hollow section of the gas injection section for preventing the inert gas from directly flowing to the central portions of the supply ports of the inert gas.

7. The single wafer type substrate cleaning apparatus according to to claim 2, wherein the gas injection section is movable between a use position where it cooperates with the cleaning chamber and a standby position where it does not interfere with the chemical fluid supply means.

8. The single wafer type substrate cleaning apparatus according to any of claims 1 to 7, wherein the cleaning chamber is designed in such manner that an inner peripheral portion of each annular treatment bath does not contact the outer periphery of the wafer supporting section of the rotary means, and the annular gap defined between these edges is at very small intervals to prevent chemical fluids and purified water from being leaked downward.

9. The single wafer type substrate cleaning apparatus according to any of claims 1 to 7, wherein the chemical fluid supply means consist of injection nozzles for injecting and supplying cleaning fluid to the face of each wafer which is supported by the wafer rotary means from above, and the injection nozzles are provided to be horizontally turnable while directed downward, and inject and supply the cleaning fluid to the face of each wafer which is rotatably supported by the wafer rotary means while it is turned horizontally form the outer peripheral portion toward the center thereof or in standstill position as it is horizontally turned.

* * * * *

UNITED STATES PATENT AND TRADEMARK OFFICE
CERTIFICATE OF CORRECTION

PATENT NO.    : 6,807,974 B2
DATED         : October 26, 2004
INVENTOR(S)   : Yuji Ono et al.

It is certified that error appears in the above-identified patent and that said Letters Patent is hereby corrected as shown below:

Column 10,
Line 13, claim 1 should read as follows:
-- Claim 1 (Currently Amended): A single wafer type substrate cleaning apparatus for cleaning wafers, which are not stored in a cassette, one by one in a sealed cleaning housing, said apparatus comprising of:
a wafer rotary means for supporting and rotating a single wafer in the cleaning housing in the horizontal position;
a cleaning chamber provided at the outer peripheral portion of the wafer rotary means for forming a cleaning treatment space for cleaning each wafer which is rotatably supported by the wafer rotary means,
wherein the cleaning chamber is movable up and down relative to the wafer rotary means, and the plural stages of the annular treatment baths forming the cleaning treatment space are arranged vertically in and concentrically with an inner peripheral portion of the cleaning chamber so as to surround the wafer supported by the wafer rotary means, and where depending on the cleaning treatment step to be employed, one of the annular treatment baths is accordingly moved to a position corresponding to the wafer supported by the wafer rotary means when the cleaning chamber is moved up and down;
a chemical fluid supply means for supplying cleaning fluids(s) to the face of the wafer which is rotatably supported by the wafer rotary means; and
an inert gas supply means for supplying inert gas to prevent oxidation on the face of the wafer which is rotatably supported by the wafer rotary means;
wherein the number of supply ports of the inert gas supply means is such that the number of supply ports at the outer peripheral portion of the face of the wafer is larger than that at the center thereof. --.

Signed and Sealed this

Seventh Day of March, 2006

JON W. DUDAS
*Director of the United States Patent and Trademark Office*